(12) United States Patent
Wang et al.

(10) Patent No.: US 11,302,524 B2
(45) Date of Patent: Apr. 12, 2022

(54) METAL CONTAMINATION TEST APPARATUS AND METHOD

(71) Applicant: YANGTZE MEMORY TECHNOLOGIES CO., LTD., Wuhan (CN)

(72) Inventors: Bingguo Wang, Wuhan (CN); Hongxia Ma, Wuhan (CN); Hongbin Zhu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 102 days.

(21) Appl. No.: 16/862,354

(22) Filed: Apr. 29, 2020

(65) Prior Publication Data

US 2021/0249247 A1 Aug. 12, 2021

Related U.S. Application Data

(63) Continuation of application No. PCT/CN2020/074586, filed on Feb. 10, 2020.

(51) Int. Cl.
| | |
|---|---|
| *H01J 49/26* | (2006.01) |
| *G01N 23/223* | (2006.01) |
| *H01J 49/04* | (2006.01) |
| *H01J 49/10* | (2006.01) |
| *H01J 49/24* | (2006.01) |
| *H01L 21/67* | (2006.01) |

(52) U.S. Cl.
CPC .......... *H01J 49/26* (2013.01); *G01N 23/223* (2013.01); *H01J 49/0409* (2013.01); *H01J 49/0459* (2013.01); *H01J 49/105* (2013.01); *H01J 49/24* (2013.01); *H01L 21/67288* (2013.01); *G01N 2223/6116* (2013.01)

(58) Field of Classification Search
CPC .... H01J 49/26; H01J 49/0409; H01J 49/0459; H01J 49/105; H01J 49/24; G01N 23/223; G01N 2223/6116; H01L 21/67288; H01L 21/67109; H01L 21/67248; H01L 21/67754; H01L 21/67253; H01L 22/12
USPC ......................................... 250/281, 282, 288
See application file for complete search history.

(56) References Cited

U.S. PATENT DOCUMENTS

| | | | |
|---|---|---|---|
| 2001/0019896 A1 | 9/2001 | Choi et al. | |
| 2006/0213539 A1* | 9/2006 | Hasebe | ............... C23C 16/4404 134/22.1 |
| 2011/0151592 A1 | 6/2011 | Libbert et al. | |
| 2019/0206663 A1* | 7/2019 | Wiederin | ............. G01N 21/274 |

FOREIGN PATENT DOCUMENTS

| | | |
|---|---|---|
| CN | 102687260 A | 9/2012 |
| CN | 104576453 A | 4/2015 |
| CN | 108766902 A | 11/2018 |

(Continued)

*Primary Examiner* — Michael Maskell
(74) *Attorney, Agent, or Firm* — Bayes PLLC

(57) ABSTRACT

Embodiments of apparatus and method for testing metal contamination are disclosed. In an example, an apparatus for testing metal contamination includes a chamber in which a test object is placed, a gas supply configured to supply nitrogen gas into the chamber, a pressure controller configured to apply a pressure of at least about 1 torr in the chamber, and a measurement unit configured to measure a concentration of a metal from the test object.

20 Claims, 5 Drawing Sheets

(56) References Cited

FOREIGN PATENT DOCUMENTS

| | | |
|---|---|---|
| CN | 110186994 A | 8/2019 |
| JP | H03101246 A | 4/1991 |
| TW | 201906003 A | 2/2019 |
| TW | I671841 B | 9/2019 |
| TW | I716354 B | 1/2021 |

* cited by examiner

METAL CONTAMINATION TEST APPARATUS AND METHOD

CROSS-REFERENCE TO RELATED APPLICATIONS

This application is continuation of International Application No. PCT/CN2020/074586, filed on Feb. 10, 2020, entitled "METAL CONTAMINATION TEST APPARATUS AND METHOD," which is hereby incorporated by reference in its entirety.

BACKGROUND

Embodiments of the present disclosure relate to metrology apparatus and method in semiconductor manufacturing.

In semiconductor manufacturing, wafers may become contaminated with metals as particles or in molecular or atomic form, which can affect product yield of the devices as semiconductor devices are sensitive to the contamination. Contamination currently accounts for a large percentage of the yield losses in semiconductor device manufacturing. Metal contamination on wafers also causes cross-contamination in the process line as the contaminated wafers being transferred between different fabrication equipment. The current industry trend is toward the manufacture of semiconductor devices, which exhibit faster operational speeds, smaller feature sizes, larger scales of integration, and lower manufacturing costs from yield enhancements and defect reduction. As device features continue to shrink to satisfy these goals, the need to characterize trace metal contamination on wafer surfaces becomes more important.

SUMMARY

Embodiments of apparatus and method for testing metal contamination are disclosed herein.

In one example, an apparatus for testing metal contamination includes a chamber in which a test object is placed, a gas supply configured to supply nitrogen gas into the chamber, a pressure controller configured to apply a pressure of at least about 1 torr in the chamber, and a measurement unit configured to measure a concentration of a metal from the test object.

In another example, a system includes a semiconductor fabrication apparatus and a metal contamination measurement unit. The semiconductor fabrication apparatus includes a chamber in which a bare wafer and a quartz piece contaminated by a metal are placed, a gas supply configured to supply nitrogen gas into the chamber, and a pressure controller configured to apply a pressure of at least about 1 torr in the chamber. The metal contamination measurement unit is configured to measure a concentration of the metal from the bare wafer.

In still another example, a method for testing metal contamination is disclosed. A test object is provided in a chamber. Nitrogen gas is supplied into the chamber. A pressure of at least about 1 torr is applied in the chamber. A concentration of a metal is measured from the test object.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
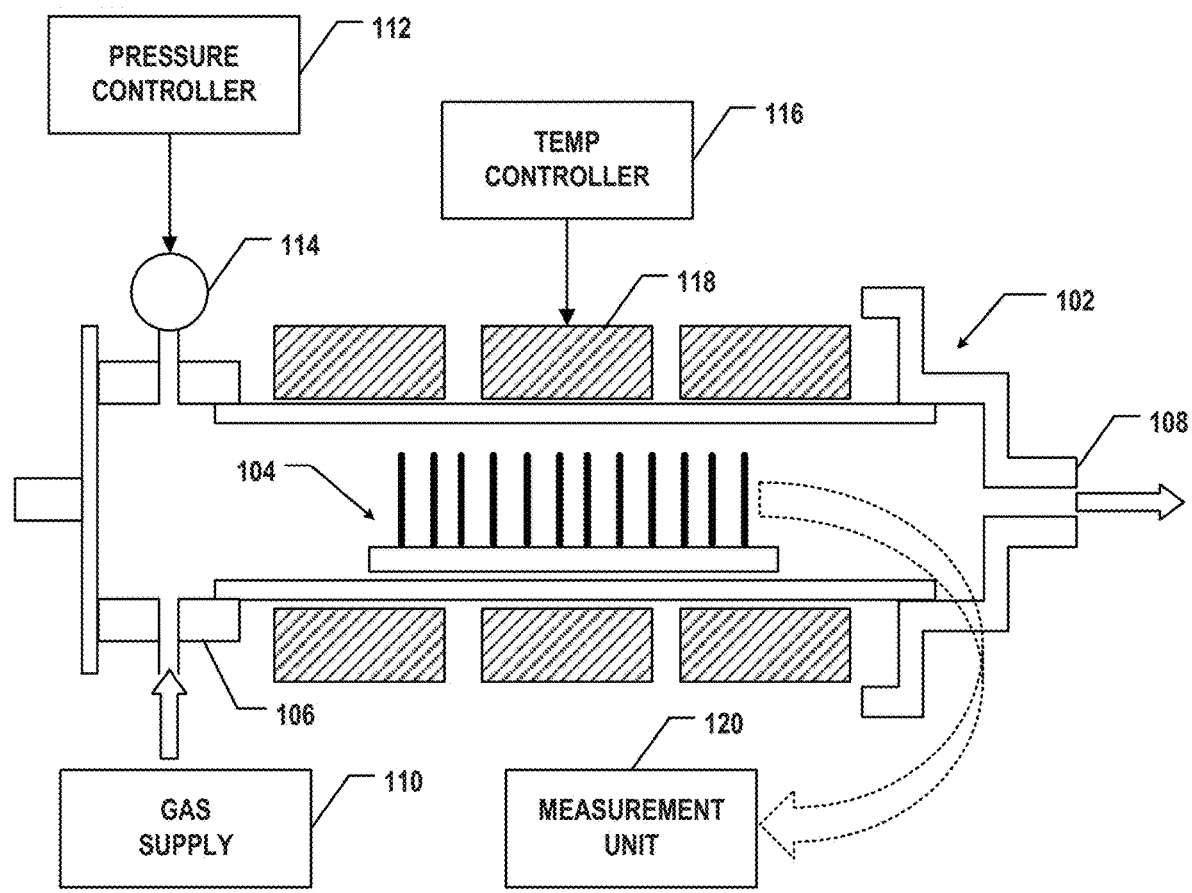
FIG. 1 illustrates a detailed schematic diagram of an exemplary apparatus for testing metal contamination, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

One source of metal contamination in semiconductor manufacturing is metals in quartz pieces used in semiconductor fabrication equipment, such as low-pressure chemical vapor deposition (LPCVD). Metal atoms, such as copper, may contaminate the quartz pieces (e.g., wafer boats, furnace tubes, etc.) when making or installing the equipment, or due to cross-contamination from other metal-involved processes. Metal contamination in the quartz pieces may also come from metal constitutions of the quartz material itself. During the fabrication process, metal contamination in the quartz pieces can come out from the quartz pieces to further contaminate the product wafers, causing yield losses. As a result, the metal contamination test needs to be performed to filter out certain quartz pieces with excess metal contamination from the process line.

One way of testing metal contamination in quartz pieces involves running a bare wafer through a testing procedure in a low-pressure (e.g., 0.3 torr), nitrogen environment with the quartz pieces and measuring the metal concentration from the bare wafer after the process. For example, a copper concentration above $1 \times 10^{10}$ atoms/cm$^2$ on the test bare wafer may indicate that the quartz wafer holder holding the wafer is contaminated. However, the inventors have observed that certain conditions, such as elevated pressure and/or the introduction of ammonia, can cause more metal atoms to come out from the quartz pieces to contaminate the product wafers in real processes, such as during silicon nitride deposition (which involves ammonia as a deposition precursor) or any CVD process with higher deposition rate using higher pressure. As a result, the metal contamination test under a low-pressure condition cannot fully reveal the metal contamination that may occur in actual process cycles.

Various embodiments in accordance with the present disclosure provide a reliable apparatus and method for testing metal contamination under an elevated pressure, which better mimics the actual process conditions. In some embodiments, ammonia is introduced into the test environment as well because the inventors have observed that ammonia could cause more metal (e.g., copper) contamination to the wafers. The present disclosure can thus increase the product yield, with less metal contamination even in extreme process conditions. The present disclosure further provides various system configurations for testing metal contamination to adapt different setups and needs of a process line.

FIG. 1 illustrates a detailed schematic diagram of an exemplary apparatus 100 for testing metal contamination, according to some embodiments of the present disclosure. As described below in detail, apparatus 100 can test metal contamination in a quartz piece by measuring the concentration of metal contaminant(s) from a bare wafer undergone a testing procedure in a high-pressure (and with ammonia in some cases) condition. In some embodiments, apparatus 100 includes a chamber 102 in which a test object 104 is placed. Chamber 102 can be a reactor tube or a furnace tube, such as a silica or quartz reactor tube used in an LPCVD apparatus. Chamber 102 includes a gas inlet 106 and a gas exhaust 108 to allow one or more gases to be supplied into chamber 102 before running the testing procedure and be purged out of chamber 102 once the testing procedure is completed. In some embodiments, apparatus 100 includes a gas supply 110 configured to supply one or more gases into chamber 102 through gas inlet 106. In one example, gas supply 110 may supply nitrogen ($N_2$) gas into chamber 102. In another example, gas supply 110 may supply ammonia ($NH_3$) into chamber 102. In still another example, gas supply 110 may supply both nitrogen gas and ammonia into chamber 102.

In some embodiments, apparatus 100 also includes a pressure controller 112 configured to apply a pressure of at least about 1 torr, such as at least 1 torr, in chamber 102. A pressure gauge 114 is attached to chamber 102 to monitor the pressure in chamber 102 to ensure an elevated pressure condition (at least 1 torr) during the testing procedure, different from the low-pressure condition (e.g., 0.3 torr used by LPCVD) used by the conventional testing procedure, according to some embodiments. In some embodiments, pressure controller 112 controls the pressure to be between about 1 torr and about 100 torr, such as between 1 torr and 100 torr. In some embodiments, pressure controller 112 controls the pressure to be between about 15 torr and about 100 torr, such as between 15 torr and 100 torr (e.g., 15 torr, 20 torr, 25 torr, 30 torr, 35 torr, 40 torr, 45 torr, 50 torr, 55 torr, 60 torr, 65 torr, 70 torr, 75 torr, 80 torr, 85 torr, 90 torr, 95 torr, 100 torr, any range bounded by the lower end by any of these values, or in any range defined by any two of these values). In one example, the pressure may be about 15 torr, such as 15 torr. In another example, the pressure may be about 30 torr, such as 30 torr. I still another example, the pressure may be about 50 torr, such as 50 torr. Gas supply 110 and pressure controller 112 work together to keep supplying both nitrogen gas and ammonia into chamber 102 and maintain the pressure in chamber 102 to be at least 1 torr during the testing procedure, according to some embodiments.

In some embodiments, apparatus 100 further includes a temperature controller 116 configured to apply a temperature between about 600° C. and about 900° C., such as between 600° C. and 900° C., in chamber 102 through one or more heaters 118. Heaters 118 can include a radio frequency (RF) heater, an infrared (IR) heater, or a thermal resistance heater. In some embodiments, temperature controller 116 controls the temperature to be between about 700° C. and about 800° C., such as between 700° C. and 800° C. (e.g., 700° C., 720° C., 740° C., 760° C., 780° C., 800° C., any range bounded by the lower end by any of these values, or in any range defined by any two of these values). In one example, the temperature may be about 760° C., such as 760° C.

As shown in FIG. 1, test object 104 can be placed into chamber 102 during the testing procedure with enhanced conditions described above. Test object 104 includes one or more bare wafers and quartz pieces, according to some embodiments. As used herein, a "wafer" is a piece of a semiconductor material for semiconductor devices to build in and/or on it and that can undergo various fabrication processes before being separated into dies. A bare wafer is a wafer in its original form before undergoing any fabrication process and thus, is free of any metal to be tested. In other words, the concentration of the metal contaminant to be tested is nominally 0 at the bare wafer before the testing procedure. The bare wafer can include silicon (e.g., single crystalline silicon), silicon germanium (SiGe), gallium arsenide (GaAs), germanium (Ge), silicon on insulator (SOI), or any other suitable materials. In one example, the bare wafer may be a bare silicon wafer.

A quartz piece can include any piece of a component made of quartz used by a semiconductor fabrication apparatus including, but not limited to, a wafer holder (e.g., a wafer boat), a container (e.g., a crucible), a reaction tube, or a furnace tube. In some embodiments, the quartz piece includes one or more metals due to metal contamination (i.e., metal contaminants) from various sources, such as making and installing the quartz piece, cross-contamination, or natural metal constitutions of the quartz material itself. That is, the quartz piece may be contaminated by one or more metals. The metal contaminants (i.e., the metals to be tested) can include heavy metals, such as copper (Cu), iron (Fe), nickel (Ni), chromium (Cr), cobalt (Co), or molybdenum (Mo), alkali metals, such as sodium (Na), potassium (K), lithium (Li), or calcium (Ca), or any other metals, such as aluminum (Al), magnesium (Mg), etc. In some embodiments, the metal contaminants include copper.

Figure 2A:
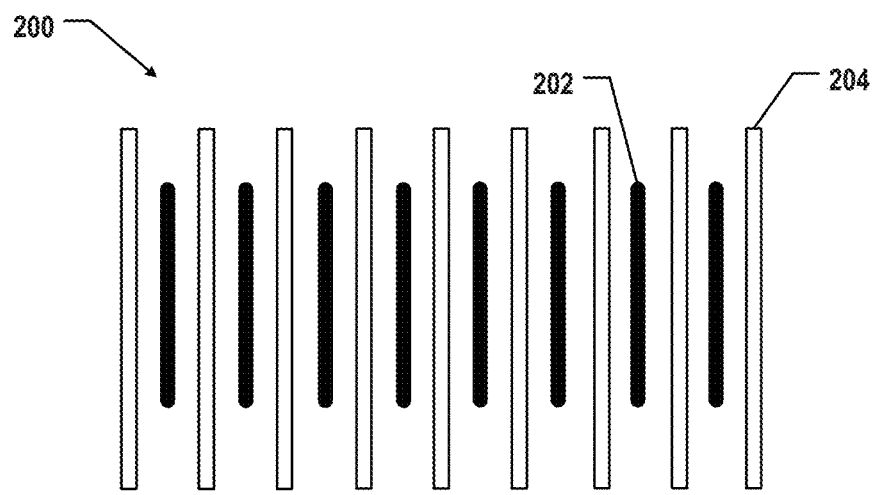
FIG. 2A illustrates a cross-section of an exemplary test object including bare wafers and a wafer holder, according to some embodiments of the present disclosure.
Figure 2B:
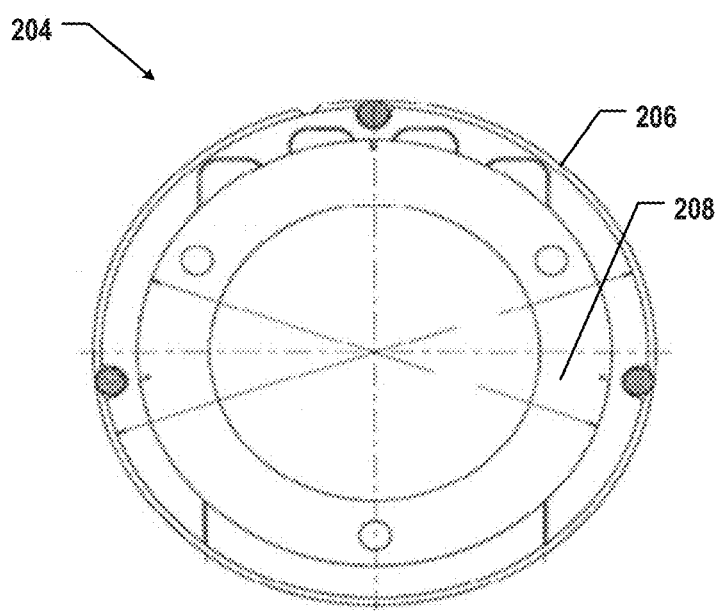
FIG. 2B illustrates a top view of the exemplary wafer holder in FIG. 2A, according to some embodiments of the present disclosure.

For example, FIG. 2A illustrates a cross-section of an exemplary test object 200 including bare wafers 202 and a wafer holder 204, according to some embodiments of the present disclosure. FIG. 2B illustrates a top view of exemplary wafer holder 204 in FIG. 2A, according to some embodiments of the present disclosure. As shown in FIGS. 2A and 2B, wafer holder 204 can be a quartz wafer ring boat including a quartz boat 206 and multiple quartz rings 208 spaced apart on quartz boat 206. Each one of multiple bare wafers 202, such as a bare silicon wafer, can be held between adjacent quartz rings 208 on quartz boat 206. In some embodiments, the gap between bare wafer 202 and the closest quartz ring 208 is about 2 mm, which is considered to be a short distance for the metal contaminant to travel from quartz ring 208 to bare wafer 202 to cause contamination. It is understood that during the testing procedure, the number of bare wafers 202 held by wafer holder 204 is not limited and can be one or multiple bare wafers 202. In some embodiments, multiple bare wafers 202 are used for metal contamination test to get a full picture of the metal contamination at different locations in wafer holder 204.

Referring back to FIG. 1, apparatus 100 further includes a measurement unit 120 configured to measure a concentration of a metal (i.e., metal contaminant) from test object 104. Under the enhanced conditions described above (e.g., elevated pressure and/or with ammonia), the metal contaminant can come off from one or more quartz pieces (e.g., a quartz tube or a quartz wafer holder) and transfer to test object 104, for example, the bare wafer of test object 104. The concentration of the metal contaminant measured from the bare wafer thus can indicate the level of metal contamination in the quartz pieces. Measurement unit 120 can include any devices that can form wafer surface contamination metrology, e.g., measuring metal concentration, including, but not limited to total reflection x-ray fluorescence (TXRF) or inductively coupled plasma mass spectrometry (ICP-MS). TXRF uses x-ray excitation of wafer surface to determine the concentration of metal contaminants and concentrations thereof. ICP-MS ionizes the sample using inductively coupled plasma. Once ionized the molecules (e.g., metals) that make up the sample are separated based on its mass-to-charge ratio and quantified using a mass spectrometer. In some embodiments, vapor phase decomposition TXRF (VPD-TXRF) or VPD-ICP-MS is used by measurement unit 120.

Figure 3:
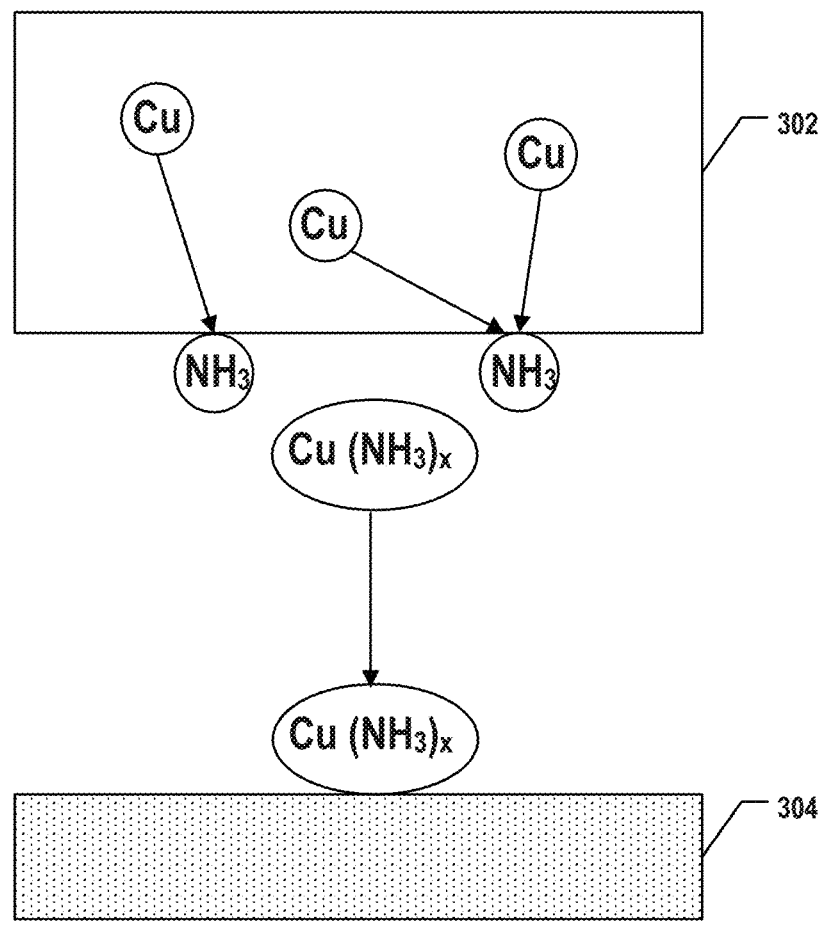
FIG. 3 illustrates an exemplary process of extracting copper contaminant from a quartz piece to a bare wafer in the presence of ammonia, according to some embodiments of the present disclosure.

FIG. 3 illustrates an exemplary process of extracting copper contaminant from a quartz piece 302 to a bare wafer 304 in the presence of ammonia, according to some embodiments of the present disclosure. Ammonia ($NH_3$) can be used as a gas-precursor in depositing silicon nitride ($Si_3N_4$) using LPCVD following the chemical reaction: $3SiH_4 + 4NH_3 \rightarrow Si_3N_4 + 12H_2$. However, not all the ammonia is consumed by the chemical reaction to form silicon nitride. As shown in FIG. 3, ammonia can extract copper (Cu) atoms from quartz piece 302 and form copper ammonia complex ($Cu(NH_3)_x$), which can be deposited onto the surface of bare wafer 304. The concentration of the copper ammonia complex can be measured by measurement unit 120, e.g., using VPD-TXRF or VPD-ICP-MS, which can indicate the copper concentration in quartz piece 302. In one example, wafer holder 204 in FIG. 2A is an example of quartz piece 302, and bare wafer 202 is an example of bare wafer 304. Due to the relatively small distance (e.g., <2 mm) between wafer holder 204 and bare wafer 304, the copper ammonia complex formed from copper and ammonia is more easily transferred to bare wafer 304 and measured by measurement unit 120. In some embodiments, the introduction of ammonia into a nitrogen gas environment can significantly increase (e.g., about doubling) the copper concentration measured from bare wafer 304. In some embodiments, the increase of the flow rate of ammonia can also increase the copper concentration measured from bare wafer 304.

Besides ammonia, an elevated pressure in chamber 102 can also increase the metal concentration measured from the bare wafer of test object 104. In some embodiments, a higher pressure can increase the percentage of ammonia that can be reacted with copper, thereby increasing the metal concentration at the bare wafer. Moreover, the inventors have observed that even without the presence of ammonia (in a pure nitrogen gas environment), elevating pressure in chamber 102 can facilitate copper atoms to come out from the quartz piece, which are eventually transferred to the surface of the bare wafer to be measured. In one example, by increasing the pressure in chamber 102 from 0.3 torr to 15 torr, the copper concentration measured from a bare wafer using apparatus 100 in FIG. 1 may be increased by more than 10 times.

Figure 4C:
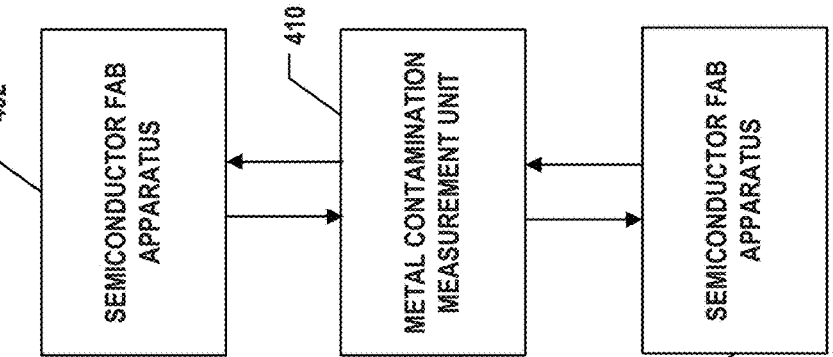
FIGS. 4A-4C illustrate schematic diagrams of various exemplary systems for testing metal contamination in semiconductor fabrication apparatus, according to some embodiments of the present disclosure.
Figure 4B:
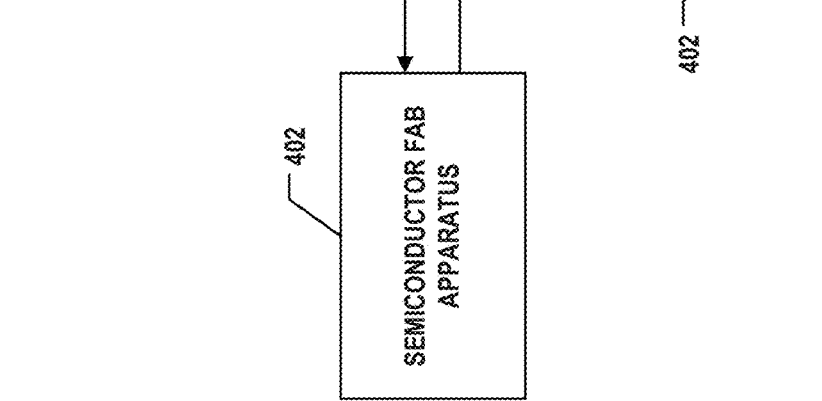
Figure 4A:
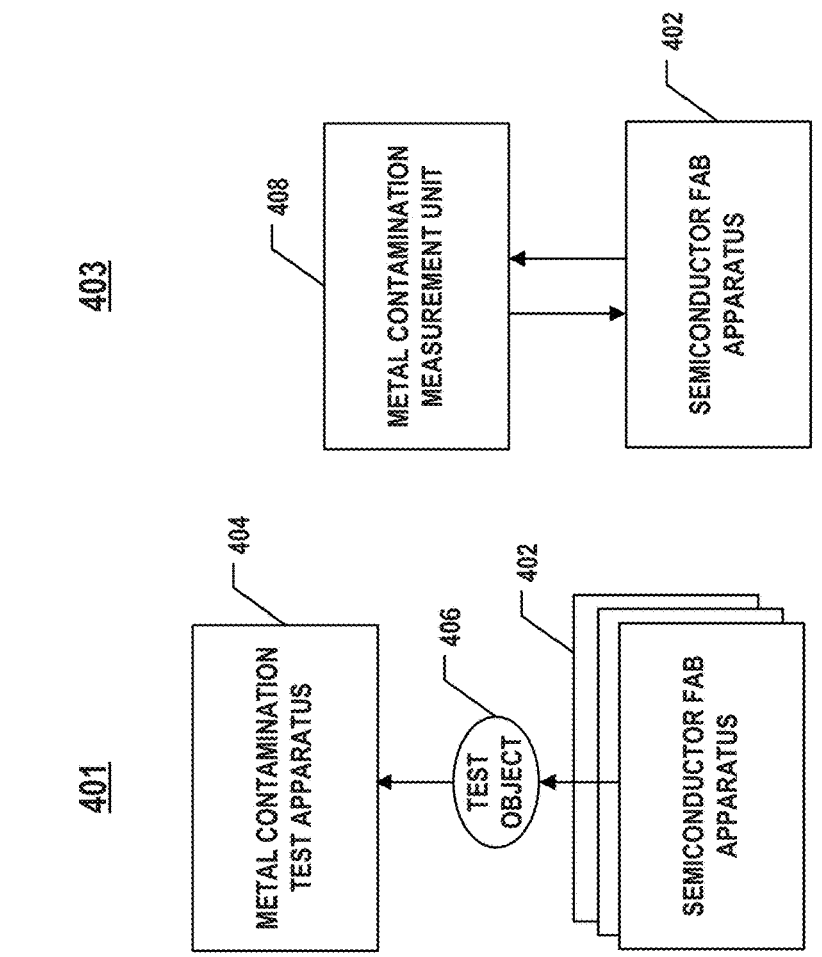

The metal contamination testing procedure with enhanced conditions disclosed herein can be implemented in various configurations in a process line. FIG. 4A-4C illustrate schematic diagrams of various exemplary systems 401, 403, and 405 for testing metal contamination in semiconductor fabrication apparatus 402, according to some embodiments of the present disclosure. Semiconductor fabrication apparatus 402 can include any fabrication equipment in a process line that includes and/or employs a quartz piece that may be contaminated by metal contaminants Semiconductor fabrication apparatus 402 can include, but not limited to, equipment for performing CVD, physical vapor deposition (PVD) (e.g., evaporation, sputtering), molecular beam epitaxy (MBE), ion implantation, thermal oxidation, dry etching, etc. In some embodiments, semiconductor fabrication apparatus 402 includes an LPCVD apparatus. LPCVD is a CVD technology that uses heat to initiate a reaction of a precursor gas on a solid substrate. LPCVD can be used to deposit a wide range of films or layers, such as polysilicon layers, silicon nitride layers, and silicon oxide layers, at atmosphere or low pressure (e.g., 0.3 torr) with conformal step coverage.

In system 401 shown in FIG. 4A, a metal contamination test apparatus 404 can test metal contamination of test objects 406 from any one of semiconductor fabrication apparatuses 402 in a process line. That is, metal contamination test apparatus 404 can serve as a standalone, central metrology instrument for testing metal contamination in an offline manner. In some embodiments, metal contamination test apparatus 404 includes the components of apparatus 100 described above, e.g., chamber 102, gas supply 110, pressure controller 112, and measurement unit 120 and thus, can perform the testing procedure disclosed herein alone (i.e., no need to work with semiconductor fabrication apparatus 402). Any quartz pieces from semiconductor fabrication apparatuses 402 in the process line can be removed from semiconductor fabrication apparatuses 402 and loaded into metal contamination test apparatus 404 for testing. For example, one or more bare wafers may be held in a quartz wafer boat to form test object 406 and tested by metal contamination test apparatus 404 in an offline manner without any participation of semiconductor fabrication apparatuses 402.

In system 403 shown in FIG. 4B, a metal contamination test apparatus 408 can be attached and connected to a semiconductor fabrication apparatus 402 for testing metal contamination of semiconductor fabrication apparatuses 402. That is, metal contamination test apparatus 408 can be a metal contamination testing sub-system dedicated to a specific semiconductor fabrication apparatus 402. In other words, metal contamination test apparatus 408 and semiconductor fabrication apparatus 402 can be integrated into a single fabrication equipment with metal contamination testing function. In some embodiments, metal contamination test apparatus 408 includes only some of the components of apparatus 100 described above, e.g., measurement unit 120, since other components, such as chamber 102, gas supply 110, and pressure controller 112 are already parts of semiconductor fabrication apparatus 402, such as an LPCVD apparatus. Nevertheless, the enhanced conditions of the testing procedure disclosed herein may still be controlled by components of semiconductor fabrication apparatus 402 (e.g., gas supply 110 and pressure controller 112), and the metal concentration may be measured by metal contamination test apparatus 408.

In system 405 shown in FIG. 4C, a metal contamination test apparatus 410 can be attached and connected to any one of semiconductor fabrication apparatuses 402 in the process line for testing metal contamination of semiconductor fabrication apparatuses 402. Different from metal contamination test apparatus 408 in FIG. 4B, which is a dedicated testing sub-system for a specific semiconductor fabrication apparatus 402, metal contamination test apparatus 410 can be a generic, removable testing sub-system that can work with different semiconductor fabrication apparatuses 402 as needed. For example, metal contamination test apparatus 410 may be attached and connected to one semiconductor fabrication apparatus 402 to perform the metal testing procedure disclosed herein and then attached and connected to another semiconductor fabrication apparatus 402 to perform the metal testing procedure disclosed herein again.

Figure 5:
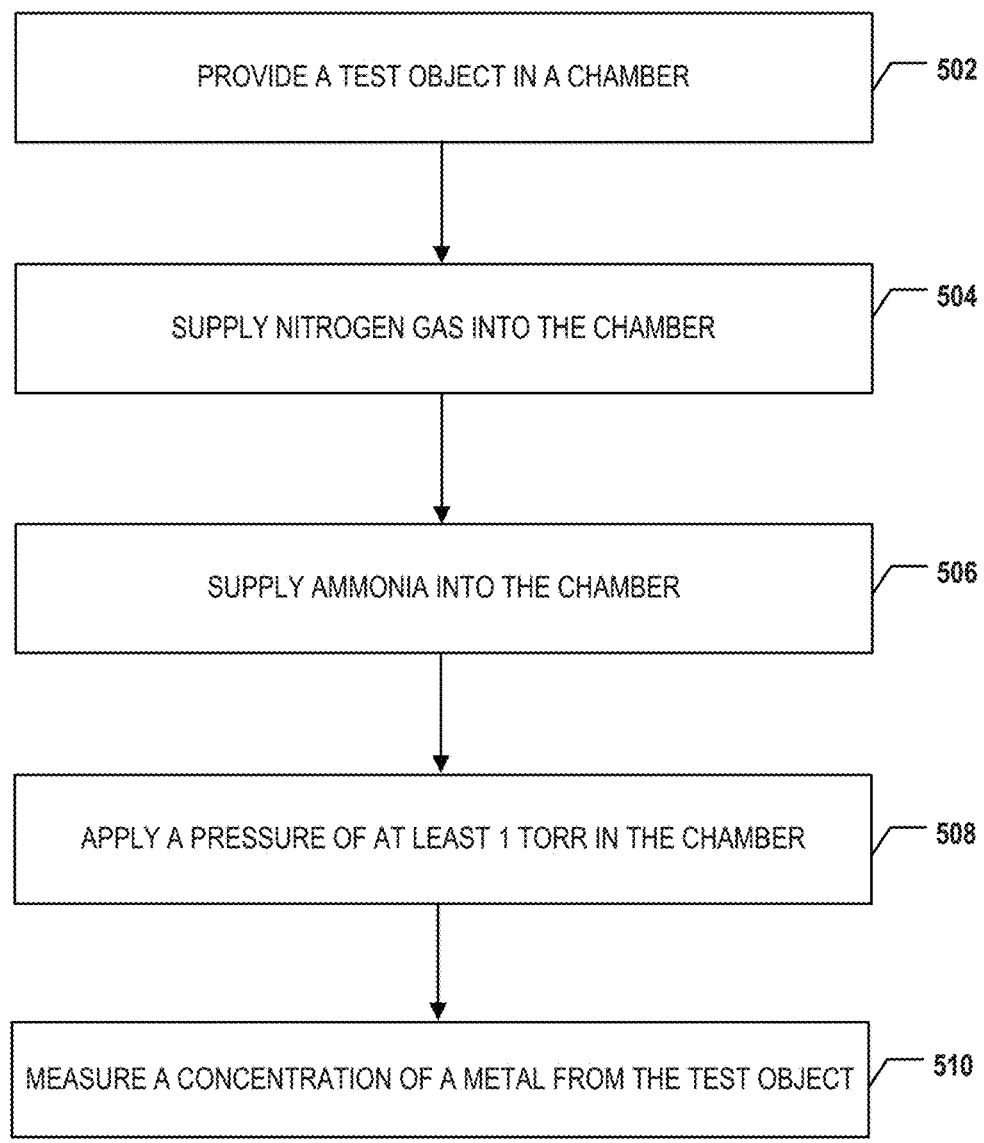
FIG. 5 is a flowchart of an exemplary method for testing metal contamination, according to some embodiments of the present disclosure.

FIG. 5 is a flowchart of a method 500 for testing metal contamination, according to some embodiments of the present disclosure. Examples of the apparatus that can perform operations of method 500 include apparatus 100 depicted in FIG. 1. It is understood that the operations shown in method 500 are not exhaustive and that other operations can be performed as well before, after, or between any of the illustrated operations. Further, some of the operations may be performed simultaneously, or in a different order than shown in FIG. 5.

Referring to FIG. 5, method 500 starts at operation 502, in which a test object is provided in a chamber. For example, test object 104 is provided in chamber 102 as shown in FIG. 1. In some embodiments, the test object includes a bare wafer and a quartz piece including a metal (e.g., contaminated by the metal). The quartz piece can include a wafer holder holding the bare wafer, and the metal can include copper.

Method 500 proceeds to operation 504, as illustrated in FIG. 5, in which nitrogen gas is supplied into the chamber. For example, nitrogen gas is supplied by gas supply 110 into chamber 102 through gas inlet 106 as shown in FIG. 1. Method 500 proceeds to operation 506, as illustrated in FIG. 5, in which ammonia is supplied into the chamber. For example, ammonia is supplied by gas supply 110 into chamber 102 through gas inlet 106 as well as shown in FIG. 1.

Method 500 proceeds to operation 508, as illustrated in FIG. 5, in which a pressure of at least about 1 torr is applied in the chamber. For example, a pressure of at least 1 torr is applied by pressure controller 112 in chamber 104, which is measured and monitored by gas gauge 114 as shown in FIG. 1. In some embodiments, the pressure is controlled to be between 15 torr and 100 torr, such as 30 torr.

In some embodiments, a temperature between about 600° C. and about 900° C. is applied in the chamber. For example, a temperature between 600° C. and 900° C. is applied by temperature controller 116 through heaters 118 in chamber 102 as shown in FIG. 1.

Method 500 proceeds to operation 510, as illustrated in FIG. 5, in which a concentration of the metal is measured from the test object. For example, a concentration of the metal contaminant is measured from test object 406 by measurement unit 120 as shown in FIG. 1. In some embodiments, the concentration of the metal is measured from the bare wafer. In some embodiments, the concentration of the metal is measured by TXRF or ICP-MS.

According to one aspect of the present disclosure, an apparatus for testing metal contamination includes a chamber in which a test object is placed, a gas supply configured to supply nitrogen gas into the chamber, a pressure controller configured to apply a pressure of at least 1 torr in the chamber, and a measurement unit configured to measure a concentration of a metal from the test object.

In some embodiments, the test object includes a bare wafer and a quartz piece comprising the metal, and the concentration of the metal is measured from the bare wafer.

In some embodiments, the quartz piece includes a wafer holder holding the bare wafer.

In some embodiments, the metal includes copper.

In some embodiments, the pressure is between about 15 torr and about 100 torr. In some embodiments, the pressure is about 30 torr.

In some embodiments, the gas supply is further configured to supply ammonia into the chamber.

In some embodiments, the measurement unit includes TXRF or ICP-MS.

In some embodiments, the apparatus further includes a temperature controller configured to apply a temperature between about 600° C. and about 900° C. in the chamber.

According to another aspect of the present disclosure, a system includes a semiconductor fabrication apparatus and a metal contamination measurement unit. The semiconductor fabrication apparatus includes a chamber in which a bare wafer and a quartz piece contaminated by a metal are placed, a gas supply configured to supply nitrogen gas into the chamber, and a pressure controller configured to apply a pressure of at least 1 torr in the chamber. The metal contamination measurement unit is configured to measure a concentration of the metal from the bare wafer.

In some embodiments, the quartz piece includes a wafer holder holding the bare wafer.

In some embodiments, the metal includes copper.

In some embodiments, the pressure is between about 15 torr and about 100 torr.

In some embodiments, the pressure is about 30 torr.

In some embodiments, the gas supply is further configured to supply ammonia into the chamber.

In some embodiments, the measurement unit includes TXRF or ICP-MS.

In some embodiments, the semiconductor fabrication apparatus further includes a temperature controller configured to apply a temperature between about 600° C. and about 900° C. in the chamber.

In some embodiments, the semiconductor fabrication apparatus includes an LPCVD apparatus.

According to still another aspect of the present disclosure, a method for testing metal contamination is disclosed. A test object is provided in a chamber. Nitrogen gas is supplied into the chamber. A pressure of at least 1 torr is applied in the chamber. A concentration of a metal is measured from the test object.

In some embodiments, the test object includes a bare wafer and a quartz piece comprising the metal, and the concentration of the metal is measured from the bare wafer.

In some embodiments, the quartz piece includes a wafer holder holding the bare wafer.

In some embodiments, the metal includes copper.

In some embodiments, the pressure is between about 15 torr and about 100 torr. In some embodiments, the pressure is about 30 torr.

In some embodiments, the gas supply is further configured to supply ammonia into the chamber.

In some embodiments, the concentration of the metal is measured by TXRF or ICP-MS.

In some embodiments, a temperature between about 600° C. and about 900° C. is applied in the chamber.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. An apparatus for testing metal contamination, comprising:
a chamber in which a test object is placed, the test object comprising one or more bare wafers and a quartz piece comprising a plurality of quartz rings, and each of the one or more bare wafers being held between two adjacent quartz rings at a respective gap between the bare wafer and a corresponding quartz ring;
a gas supply configured to supply nitrogen gas into the chamber;
a pressure controller configured to apply a pressure of at least about 1 torr in the chamber; and
a measurement unit,
wherein:
the quartz piece comprises a metal, and the metal is transferred onto the one or more bare wafers under the pressure and the nitrogen gas; and
the measurement unit is configured to measure a concentration of the metal through the one or more bare wafers to obtain metal contamination information at different locations of the quartz piece.

2. The apparatus of claim 1, wherein the quartz piece comprises a wafer holder configured for holding the one or more bare wafers.

3. The apparatus of claim 1, wherein the metal comprises copper.

4. The apparatus of claim 1, wherein the pressure is between about 15 torr and about 100 torr.

5. The apparatus of claim 4, wherein the pressure is about 30 torr.

6. The apparatus of claim 1, wherein the gas supply is further configured to supply ammonia into the chamber.

7. The apparatus of claim 1, wherein the measurement unit comprises total reflection x-ray fluorescence (TXRF) or inductively coupled plasma mass spectrometry (ICP-MS).

8. The apparatus of claim 1, further comprising a temperature controller configured to apply a temperature between about 600° C. and about 900° C. in the chamber.

9. A system, comprising:
a semiconductor fabrication apparatus comprising:
a chamber in which one or more bare wafers and a quartz piece contaminated by a metal are placed, the quartz piece comprising a plurality of quartz rings, and each of the one or more bare wafers being held between two adjacent quartz rings at a respective gap between the bare wafer and a corresponding quartz ring;
a gas supply configured to supply nitrogen gas into the chamber; and
a pressure controller configured to apply a pressure of at least about 1 torr in the chamber; and
a metal contamination measurement unit,
wherein:
the metal is transferred onto the one or more bare wafers under the pressure and the nitrogen gas; and
the metal contamination measurement unit is configured to measure a concentration of the metal through the one or more bare wafers to obtain metal contamination information at different locations of the quartz piece.

10. The system of claim 9, wherein the quartz piece comprises a wafer holder configured for holding the one or more bare wafers.

11. The system of claim 9, wherein the pressure is between about 15 torr and about 100 torr.

12. The system of claim 9, wherein the gas supply is further configured to supply ammonia into the chamber.

13. A method for testing metal contamination, comprising:
providing a test object in a chamber, the test object comprising one or more bare wafers and a quartz piece comprising a plurality of quartz rings, and each of the one or more bare wafers being held between two adjacent quartz rings at a respective gap between the bare wafer and a corresponding quartz ring;
supplying nitrogen gas into the chamber;
applying a pressure of at least about 1 torr in the chamber; and
measuring a concentration of a metal through the one or more bare wafers to obtain metal contamination information at different locations of the quartz piece,
wherein:
the quartz piece comprises the metal, and the metal is transferred onto the one or more bare wafers under the pressure and the nitrogen gas.

14. The method of claim 13, wherein the metal comprises copper.

15. The method of claim 13, wherein the pressure is between about 15 torr and about 100 torr.

16. The method of claim 15, wherein the pressure is about 30 torr.

17. The method of claim 13, further comprising supplying ammonia into the chamber.

18. The method of claim 13, further comprising applying a temperature between about 600° C. and about 900° C. in the chamber.

19. The apparatus of claim 1, wherein the gap, between the bare wafer and the corresponding quartz ring, comprises a distance for the metal to be transferred from the quartz ring to the bare wafer.

20. The apparatus of claim 1, wherein the quartz piece further comprises a quartz boat, the plurality of quartz rings being spaced apart, along a horizontal direction with respect to the apparatus, on the quartz boat.

* * * * *